(12) United States Patent
Ausschnitt et al.

(10) Patent No.: US 7,439,001 B2
(45) Date of Patent: Oct. 21, 2008

(54) FOCUS BLUR MEASUREMENT AND CONTROL METHOD

(75) Inventors: Christopher P. Ausschnitt, Lexington, MA (US); Timothy A. Brunner, Ridgefield, CT (US); Shahid A. Butt, Ossining, NY (US); Daniel A. Corliss, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 607 days.

(21) Appl. No.: 11/206,326

(22) Filed: Aug. 18, 2005

(65) Prior Publication Data

US 2007/0041003 A1 Feb. 22, 2007

(51) Int. Cl.
*G03C 5/00* (2006.01)
*G03F 9/00* (2006.01)

(52) U.S. Cl. .......................................... 430/30; 430/396
(58) Field of Classification Search .................. 430/30, 430/396
See application file for complete search history.

(56) References Cited

U.S. PATENT DOCUMENTS

| | | |
|---|---|---|
| 4,166,219 A | 8/1979 | Ausschnitt et al. |
| 4,290,384 A | 9/1981 | Ausschnitt et al. |
| 4,437,760 A | 3/1984 | Ausschnitt |
| 4,538,105 A | 8/1985 | Ausschnitt |
| 4,568,189 A | 2/1986 | Bass et al. |
| 4,890,239 A | 12/1989 | Ausschnitt et al. |
| 4,898,911 A | 2/1990 | Miyashita et al. |
| 5,343,292 A | 8/1994 | Brueck et al. |
| 5,545,593 A | 8/1996 | Watkins et al. |
| 5,629,772 A | 5/1997 | Ausschnitt |
| 5,712,707 A | 1/1998 | Ausschnitt et al. |
| 5,731,877 A | 3/1998 | Ausschnitt |
| 5,756,242 A | 5/1998 | Koizumi et al. |
| 5,757,507 A | 5/1998 | Ausschnitt et al. |
| 5,776,645 A | 7/1998 | Barr et al. |
| 5,790,254 A | 8/1998 | Ausschnitt |
| 5,805,290 A | 9/1998 | Ausschnitt et al. |
| 5,877,861 A | 3/1999 | Ausschnitt et al. |
| 5,914,784 A | 6/1999 | Ausschnitt et al. |
| 5,928,822 A | 7/1999 | Rhyu |
| 5,949,547 A | 9/1999 | Tseng et al. |
| 5,952,134 A | 9/1999 | Hwang |
| 5,953,128 A | 9/1999 | Ausschnitt et al. |
| 5,965,309 A | 10/1999 | Ausschnitt et al. |
| 5,968,693 A | 10/1999 | Adams |
| 5,976,740 A | 11/1999 | Ausschnitt et al. |
| 5,981,119 A | 11/1999 | Adams |
| 5,985,495 A | 11/1999 | Okumura et al. |
| 6,003,223 A | 12/1999 | Hagen et al. |
| 6,004,706 A | 12/1999 | Ausschnitt et al. |
| 6,020,966 A | 2/2000 | Ausschnitt et al. |
| 6,027,842 A | 2/2000 | Ausschnitt et al. |
| 6,042,976 A | 3/2000 | Chiang et al. |
| 6,061,119 A | 5/2000 | Ota |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,183,919 B1 | 2/2001 | Ausschnitt et al. |
| 6,317,211 B1 | 11/2001 | Ausschnitt et al. |
| 6,335,151 B1 | 1/2002 | Ausschnitt et al. |
| 6,346,979 B1 | 2/2002 | Ausschnitt et al. |
| 6,350,548 B1 | 2/2002 | Leidy et al. |
| 6,429,667 B1 | 8/2002 | Ausschnitt et al. |
| 6,457,169 B1 | 9/2002 | Ross |
| 6,460,265 B2 | 10/2002 | Pogge et al. |
| 6,471,929 B1 | 10/2002 | Kusunoki et al. |
| 6,612,159 B1 | 9/2003 | Knutrud |
| 6,638,671 B2 | 10/2003 | Ausschnitt et al. |

(Continued)

FOREIGN PATENT DOCUMENTS

JP 61-168227 A 7/1986

(Continued)

OTHER PUBLICATIONS

Starikov, Alexander; "Exposure Monitor Structure", SPIE vol. 1261, Integrated Circuit Metrology, Inspection and Process Control IV, 1990, pp. 315-324.

(Continued)

*Primary Examiner*—Christopher G Young
(74) *Attorney, Agent, or Firm*—DeLio & Peterson, LLC; Peter W. Peterson; Wenji Li

(57) ABSTRACT

A method for optimizing imaging and process parameter settings in a lithographic pattern imaging and processing system is disclosed. The method includes correlating the dimensions of a first set of at least one control pattern printed in a lithographic resist layer, measured at three or more locations on or within the pattern which correspond to differing dose, defocus and blur sensitivity. The method then includes measuring the dimensions on subsequent sets of control patterns, printed in a lithographic resist layer, at three or more locations on or within each pattern, of which a minimum of three locations match those measured in the first set, and determining the effective dose, defocus and blur values associated with forming the subsequent sets of control patterns by comparing the dimensions at the matching locations with the correlated dependencies. A method for determining blur, focus and exposure dose error in lithographic imaging is also disclosed.

4 Claims, 11 Drawing Sheets

U.S. PATENT DOCUMENTS

| | | |
|---|---|---|
| 6,766,211 B1 | 7/2004 | Ausschnitt |
| 6,803,995 B2 | 10/2004 | Ausschnitt |
| 6,842,237 B2 | 1/2005 | Ausschnitt et al. |
| 6,869,739 B1 | 3/2005 | Ausschnitt et al. |
| 6,879,400 B2 | 4/2005 | Ausschnitt et al. |
| 2001/0001900 A1 | 5/2001 | Pogge et al. |
| 2002/0097399 A1 | 7/2002 | Ausschnitt et al. |
| 2003/0053057 A1 | 3/2003 | Mishima |
| 2003/0071997 A1 | 4/2003 | Ausschnitt et al. |
| 2003/0077527 A1 | 4/2003 | Ausschnitt et al. |
| 2003/0123052 A1 | 7/2003 | Ausschnitt et al. |

FOREIGN PATENT DOCUMENTS

| | | |
|---|---|---|
| JP | 61-170032 A | 7/1986 |
| JP | 2-260441 A | 10/1990 |
| JP | 10-213895 A | 8/1998 |
| WO | WO02/19415 | 3/2002 |

OTHER PUBLICATIONS

"Method for Measuring Semiconductor Lithographic Tool Focus and Exposure" IBM Technical Disclosure Bulletin, Jul. 1987, pp. 516-518.

FOCUS BLUR MEASUREMENT AND CONTROL METHOD

BACKGROUND OF THE INVENTION

1. Field of the Invention

The present invention relates generally to semiconductor manufacturing and, more particularly, to the characterization and control of lithographic process conditions used in microelectronics manufacturing.

2. Description of Related Art

During microelectronics manufacturing, a semiconductor wafer is processed through a series of tools that perform lithographic processing, usually followed by etch or implant processing, to form features and devices in the substrate of the wafer. Such processing has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist (hereinafter, also referred to interchangeably as resist) film on a substrate. Those segments of the absorbed aerial image, whose energy (so-called actinic energy) exceeds a threshold energy of chemical bonds in the photoactive component (PAC) of the photoresist material, create a latent image in the resist. In some resist systems the latent image is formed directly by the PAC; in others (so-called acid catalyzed photoresists), the photo-chemical interaction first generates acids which react with other photoresist components during a post-exposure bake to form the latent image. In either case, the latent image marks the volume of resist material that either is removed during the development process (in the case of positive photoresist) or remains after development (in the case of negative photoresist) to create a three-dimensional pattern in the resist film. In subsequent etch processing, the resulting resist film pattern is used to transfer the patterned openings in the resist to form an etched pattern in the underlying substrate. It is crucial to be able to monitor the fidelity of the patterns formed by both the photolithographic process and etch process, and then to control or adjust those processes to correct any deficiencies.

Lithographic systems replicate circuit patterns by projecting the image of a mask pattern onto a wafer, and consist of imaging tools that expose patterns and processing tools that coat, bake and develop the substrates. The pattern may consist of features of varying size and density, all of which must be printed simultaneously with dimensional fidelity to design. As used herein, the term critical dimension (CD) or critical width refers to the smallest dimension of a pattern or feature that can be produced by the lithographic system.

The dose setting on the imaging tool determines the average energy in the aerial image. Optimum dose produces energy equal to the resist threshold at the desired locations on the pattern. The focus setting on the imaging tool determines the average spatial modulation in the aerial image. Optimum focus produces the maximum modulation in the image. The settings of many other imaging and processing tool parameters determine the "effective" dose and defocus (deviation from optimum focus) that form the latent image in the resist film. Dimensional fidelity depends primarily on the control of these two image attributes: 1) the average energy in the image determined by dose and 2) the modulation in the image determined by focus.

To achieve optimum dimensional control the image must be brought into focus on the wafer surface at a dose corresponding to the desired pattern dimensions. This requires both that the wafer be positioned in the focal plane of the projection lens and that the focal plane be well defined and stable. Focus error has been found to have two distinct characteristics: a) defocus, where the focal plane is displaced from the desired surface, and b) blur, where the focal plane is ill-defined. While defocus and blur can have similar deleterious effects on the quality of the printed image, their cause and means of control are different.

Defocus error is shown in FIG. 1, where light energy from a source 20 is focused by a lens 22 to a focal plane 26a, which is displaced by distance D from wafer surface 24. In step and scan lithography, causes of defocus include focus system error, tilts along the scan and slit, wafer non-flatness, lens aberrations such as field curvature and astigmatism, and low-frequency vibration (i.e., where the frequency is less than the scan speed divided by the slit width). On the other hand, causes of blur include across slit tilt, chromatic aberration through the source bandwidth, and high-frequency vibration (i.e., where the frequency is greater than the scan speed divided by the slit width). Chromatic aberration and tilt induced blur are illustrated in FIGS. 2 and 3, respectively. In FIG. 2, chromatic aberration blur causes the different light frequencies from source 20 to focus at different planes 26b, 26c, 26d, and not on wafer surface 24. In FIG. 3, tilting of lens 22 at angle α from a line parallel to surface 24 causes multiple focal planes 26e, 26f, 26g at different angles or tilts of the image plane 28 from wafer surface 24 across slit 29. Thus, it would be desirable to be able to distinguish defocus from blur to optimize the lithographic patterning process.

U.S. application Ser. No. 10/771,684 by one of the instant inventors discloses a method for determining imaging and process parameter settings of a lithographic pattern imaging and processing system. The method correlates the dimensions of a first set of control patterns printed in a lithographic resist layer, measured at two or more locations on or within each pattern that correspond to different optimum focus settings, to the dose and focus settings of the pattern imaging system to produce dependencies. The method then measures the dimensions on subsequent sets of control patterns printed in a lithographic resist layer at two or more locations on or within each pattern, of which a minimum of two locations corresponding to different optimum focus settings match those measured in the first set, and subsequently determines the effective dose and defocus values associated with forming the subsequent sets of control patterns by comparing the dimensions at the matching locations with the correlated dependencies. However, the application discloses no method of determining blur error in control patterns, or the independent measurement and control of blur, defocus and dose error.

SUMMARY OF THE INVENTION

Bearing in mind the problems and deficiencies of the prior art, it is therefore an object of the present invention to provide an improved lithographic system for manufacturing microelectronic circuits and other microelectronic features.

It is another object of the present invention to provide improved utilization of measurements derived from CD metrology tools.

A further object of the invention is to provide improved process parameter monitoring and control in lithographic processing, particularly in controlling and eliminating blur error.

It is yet another object of the present invention to provide a method of distinguishing between defocus and blur error in lithographic imaging.

Still other objects and advantages of the invention will in part be obvious and will in part be apparent from the specification.

The above and other objects, which will be apparent to those skilled in art, are achieved in the present invention which is directed to a method for optimizing imaging and process parameter settings in a lithographic pattern imaging and processing system. The method comprises correlating the dimensions of a first set of at least one control pattern printed in a lithographic resist layer, measured at three or more locations on or within the pattern which correspond to differing dose, defocus and blur sensitivity. The method then includes measuring the dimensions on subsequent sets of control patterns, printed in a lithographic resist layer, at three or more locations on or within each pattern, of which a minimum of three locations match those measured in the first set, and determining the effective dose, defocus and blur values associated with forming the subsequent sets of control patterns by comparing the dimensions at the matching locations with the correlated dependencies.

The dimensions at the three or more locations are measured simultaneously. The locations of high defocus sensitivity on or within a pattern preferably correspond to different heights on the profile in the resist layer resulting from the image of a low density pattern and the location of low defocus sensitivity preferably corresponds to a single height on the profile in the resist layer resulting from the image of a high density pattern.

The dimensions of the first set of at least one control pattern may be measured at different blur condition of the pattern imaging system, with the different blur conditions being varied by changing bandwidth of illumination in the lithographic pattern imaging and processing system, or by changing tilt of an image plane in the lithographic pattern imaging and processing system.

The locations of high defocus and blur sensitivity preferably comprise isolated features for which pitch to an adjacent feature is significantly greater than twice the width of the smallest feature dimension. The locations of low defocus and blur sensitivity preferably comprise nested features for which pitch to an adjacent feature is not significantly greater than twice the width of the smallest feature dimension.

In another aspect, the present invention is directed to a method of determining blur error in lithographic imaging comprising providing nested and isolated features in a design to be lithographically patterned on a substrate and lithographically patterning the nested and isolated features on a substrate at different focus settings for different blur conditions. The method also includes measuring dimensions of the nested feature at the different focus settings for the different blur conditions and measuring dimensions of the isolated feature at the different focus setting for the different radiation blur conditions. The method then include determining contribution of blur error based on shifts in the dimension of the isolated feature at the different focus setting for the different blur conditions with respect to dimensions of the nested feature. Preferably, the dimensions of the nested and isolated features are measured simultaneously.

The method may further include determining exposure dose error and/or focus error based on any shifts in the dimension of the isolated feature at the different focus setting for the different blur conditions with respect to dimensions of the nested feature.

Preferably, the dimension of the isolated feature is sensitive to, and the dimension of the nested feature is relatively insensitive to, the different focus setting for the different blur conditions.

The different blur conditions may comprise different spectral widths of radiation used for the lithographic patterning or different tilts of the image plane.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-14 of the drawings in which like numerals refer to like features of the invention.

The inventors of the instant application have found that the response of measurable wafer pattern dimensions to dose, focus and blur errors depends on the mask pattern characteristics defined by various mask dimensions. As used herein, mask pattern dimensions are expressed at the same scale as wafer pattern dimensions. Mask patterns and wafer measurement can be designed to optimize sensitivity to individual dose, focus or blur errors or combinations of thereof. Crucial to the invention is that three or more wafer dimensions, simultaneously or separately measured, have distinguishable responses to the three primary errors: dose, defocus and blur. Ideally, each of the three dimensions would be linearly sensitive to a distinct primary error and insensitive to the other two. In practice, however, this cannot always be achieved. At or near the dose setting where feature dimensions printed on the wafer match those on the mask, so-called nested or dense features are typically sensitive to dose, but insensitive to defocus and blur, whereas isolated features are sensitive to dose, defocus and blur. As used herein, the term nested feature refers to a feature or pattern for which pitch to an adjacent feature or pattern on the mask ($P_m$) is comparable to, i.e., not significantly greater or less than, twice the width of the smallest feature printed on the wafer. Nested patterns include patterns for which assist features are used on the mask. As used herein, the term isolated feature refers to a feature or pattern for which pitch to an adjacent feature or pattern on the mask is significantly greater than twice the width of the smallest feature printed on the wafer.

Figure 3:
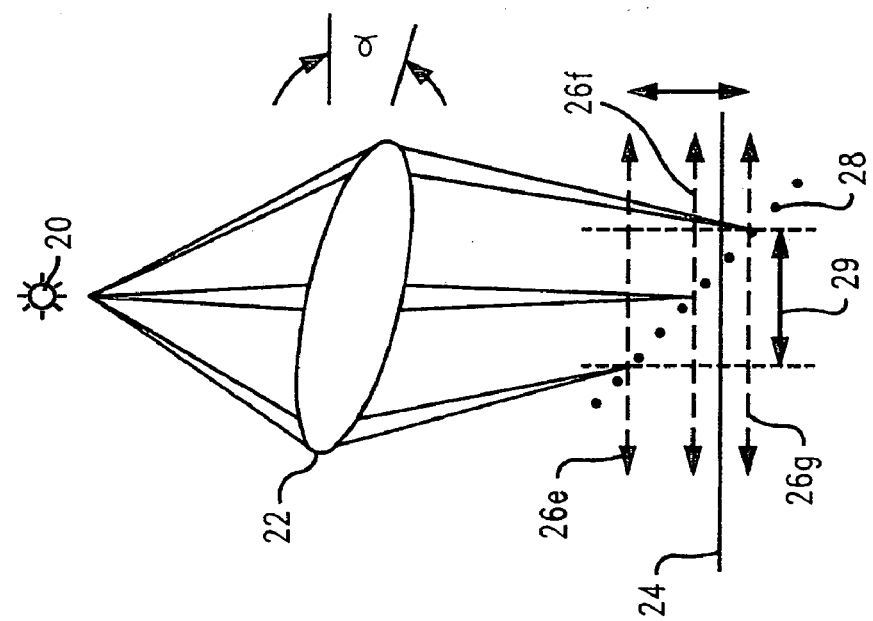
FIG. 3 is a side elevational view showing tilt induced blur in a lithographic projection system.
Figure 2:
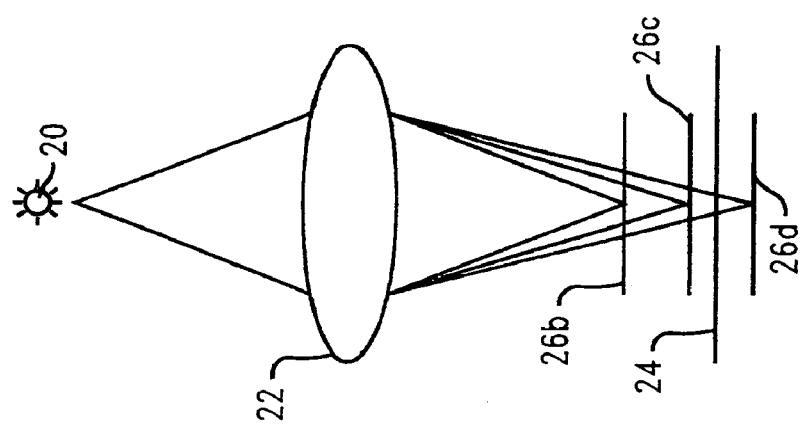
FIG. 2 is a side elevational view showing chromatic aberration blur in a lithographic projection system.
Figure 1:
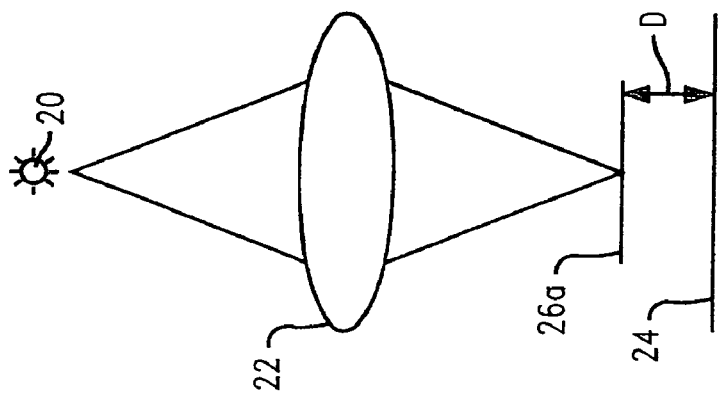
FIG. 1 is a side elevational view showing defocus error in a lithographic projection system.
Figure 4:
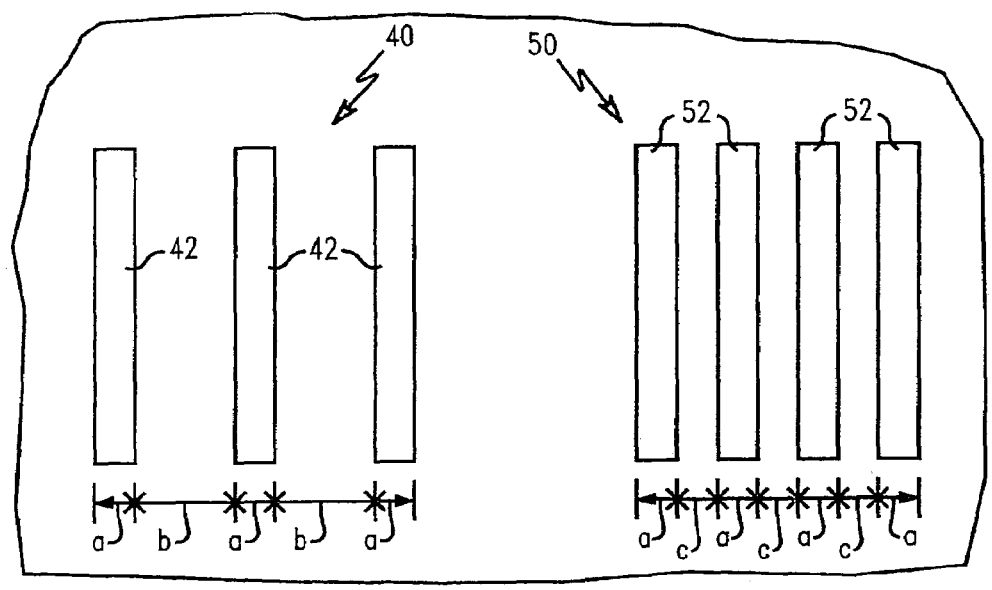
FIG. 4 is a top plan view showing isolated and nested feature patterns on a mask or lithographically produced in a resist layer on a wafer surface.

FIG. 4 depicts a pattern on a mask or as replicated lithographically in a resist layer on a wafer surface, an isolated feature pattern 40 made up of features or lines 42 of linewidth a, having a pitch of linewidth a+spacing b, where the pitch is much greater than 2×a. A nested feature pattern 50 is made up of features or lines 52 of linewidth a, having a pitch of linewidth a+spacing c, where the pitch approximately equal to 2×a. In the target embodiment shown in FIG. 4, isolated and nested patterns on the mask are transferred to the wafer without change to the pitch. In the target embodiment shown in FIG. 5, the isolated pattern 40' is composed of features 42' having width a, and pitch $P_w$, and the nested pattern 50' on the mask 60 is comprised of features 52' and 54' having distinct widths a and d, respectively, and pitch $P_m$. The width a of the so-called resolved features 42', 52' is sufficiently large for the feature to print on wafer 70, whereas the width d of the so-called subresolution assist feature (SRAF) 54' is sufficiently small for the feature not to print on the wafer, as a result of the wavelength of the illuminating light used in the lithographic process. Features 42' of isolated pattern 40' on the mask print normally on wafer 70 as features 42" of pattern 40". Despite appearing isolated on the wafer, features 52" printed using the "assisted" mask pattern respond to dose, defocus and blur as if they were nested patterns. As a result, two patterns 40" and 50" of nominally identical pitch on the wafer can be used to distinguish dose, defocus and blur. This target configuration facilitates subsequent optical measurement.

The dimensional variation of a printed feature with dose and focus is approximated by a parametric equation of the form:

$$W \cong W_0 + a_1 D + (a_2 + a_3 D)F^2$$

$$D \equiv 1 - \frac{E_0}{E}$$

-continued
$$F \equiv Z - Z_0$$

where:
$a_{1-3}$ are fitted parameters,
W is the width of the printed feature,
D is the fractional dose relative to the dose $E_0$ that produces dimension $W_0$ at focus $Z_0$,
F is the defocus relative to "best focus" $Z_0$ and
best focus $Z_0$ is defined as the focus setting at which the rate of change of CD with focus is zero:

$$\left.\frac{\partial W}{\partial Z}\right|_{Z=Z_0} = 0$$

A nested feature at the isofocal dose $$D_{isofocal} = -\frac{a_2}{a_3}$$

exhibits no focus dependence in the neighborhood of best focus. On the other hand, an isolated feature is described by the condition $$a_3 \approx 0$$

so that an isofocal dose is not possible, and focus dependence is assured.

Figure 6:
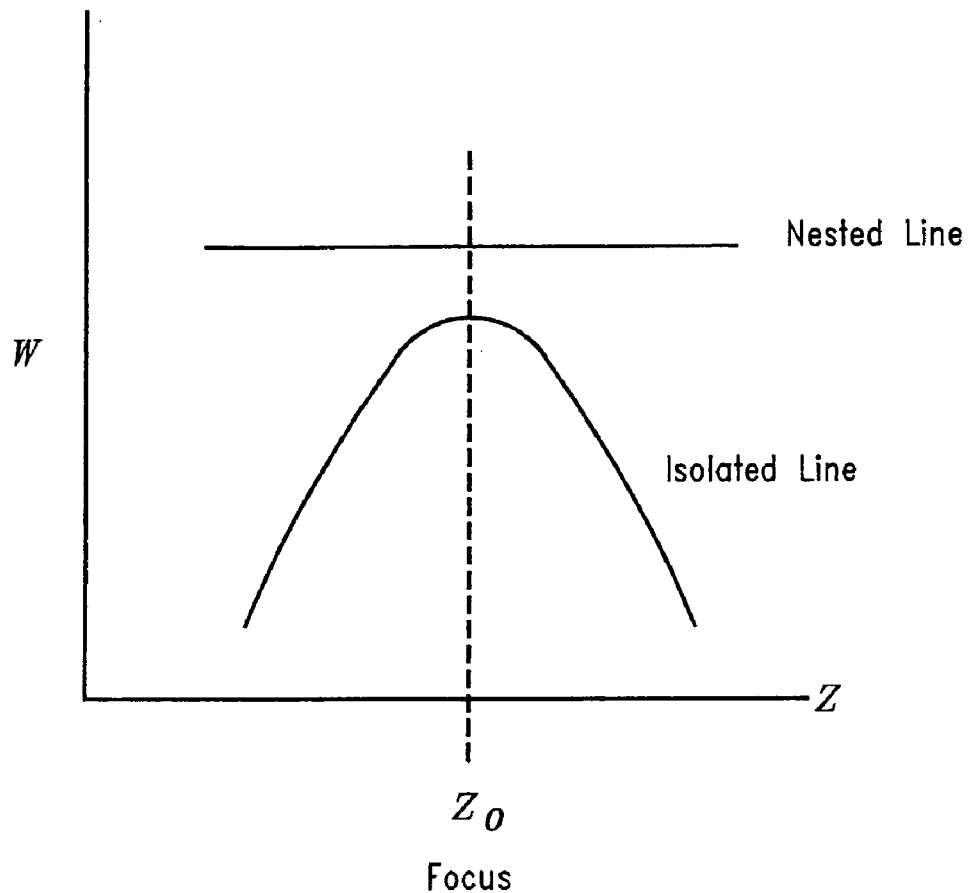
FIG. 6 is a graphical representation depicting through focus behavior of the width of simultaneously printed nested and isolated lines.

For the case of nested and isolated lines $$a_2 < 0$$

and the through focus variation is shown in FIG. 6, where the graph depicts the through focus behavior of the width W of simultaneously printed nested (at isofocal dose) and isolated lines.

In the presence of blur, the focus Z can be represented as a distribution of the form:

$$Z \Rightarrow Z + \zeta f\left(\frac{\zeta}{\Delta}\right)$$

where f is a symmetric, normalized function of the z-directed dimension $\zeta$ within the blur of characteristic width $\Delta$ such that:

$$\int_{-\infty}^{\infty} \zeta f\left(\frac{\zeta}{\Delta}\right) d\zeta = 0$$

$$\kappa \int_{-\infty}^{\infty} f\left(\frac{\zeta}{\Delta}\right) d\zeta = 1$$

The functional form of f depends on the source of blur. For tilt blur, the distribution is roughly uniform, whereas for chromatic blur it follows the shape of the illumination spectrum.

Introducing the blur distribution into the equation for the isolated linewidth $W_I$ and integrating over the blur gives:

$$W_I \cong W_0 + a_1 D + a_2 \left[ F^2 + \kappa \int_{-\infty}^{\infty} \zeta^2 f^2(\zeta) d\zeta \right]$$

Figure 7:
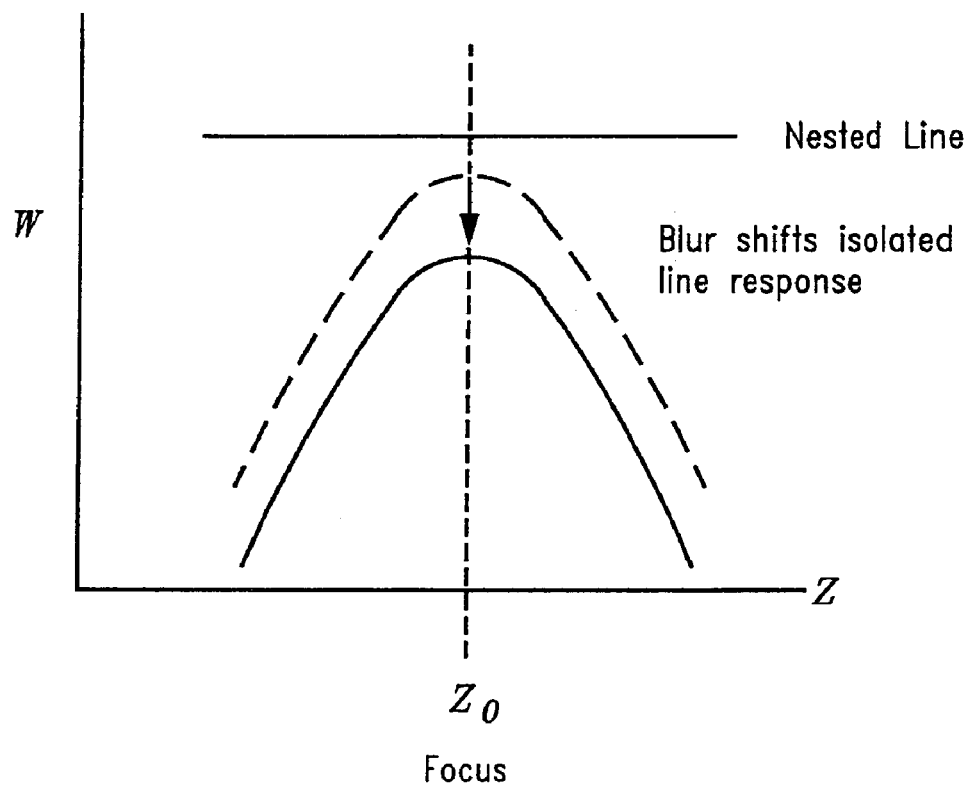
FIG. 7 is a graphical representation of the relationship of linewidth to focus showing blur shifts in an isolated line response relative to a nested line.

In the case of tilt blur, $$f\left(\frac{\zeta}{\Delta}\right) = rect\left(\frac{\zeta}{\Delta}\right)$$

so that $$\kappa \int_{-\infty}^{\infty} \zeta^2 f^2(\zeta) d\zeta = \frac{1}{\Delta} \int_{-\frac{\Delta}{2}}^{\frac{\Delta}{2}} \zeta^2 d\zeta = \frac{\Delta^2}{4}$$

and the isolated linewidth response $$W_I \cong W_0 + a_2 \frac{\Delta^2}{4} + a_1 D + a_2 F^2$$

is offset proportional to $a_2 \Delta^2$. As shown in FIG. 7, a graph of the relationship of linewidth W to focus F shows that blur shifts the isolated line response relative to that of a nested line. Moreover, the blur shifts the isolated line response in a unique direction relative to the nested line response. Thus, minimum blur corresponds to the minimum value the difference of nested linewidth and isolated linewidth, i.e., $W_N - W_I$.

Figure 8:
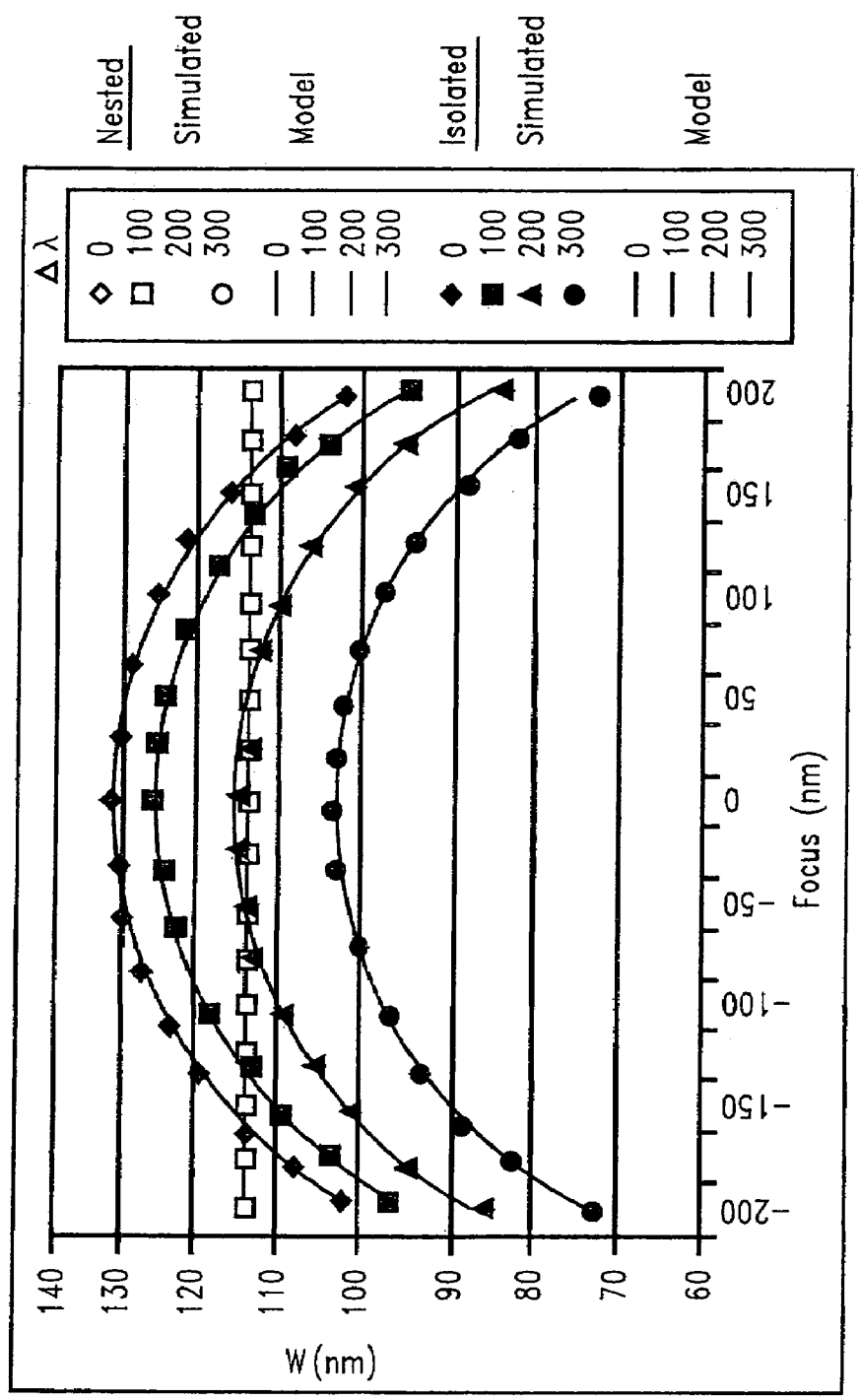
FIG. 8 is a graphical representation of the variation of linewidth as a function of defocus and spectral width for nested and isolated lines.

The ability to determine focus blur is confirmed by applying a quadratic model to the simulated dependence of nested and isolated linewidths on blur, dose and focus. The match of the model fitted to the simulated results is shown in FIG. 8 where the blur is varied using the spectral width $\Delta\lambda$ of the exposure illumination. The spectral or band width $\Delta\lambda$ is the range of wavelengths or color variation present in the exposure illumination, given in picometers. In the graph depicted in FIG. 7, simulated points and fitted-model lines show the response of linewidth W to focus (x-axis) and $\Delta\lambda$ (blur parameter) for nested lines (open points) and isolated lines (filled points) near the isofocal dose. As noted above, the nested lines are very insensitive to both focus and blur relative to the isolated lines.

As predicted by the analysis above, the blur causes a downward shift of the simulated isolated line response, but has virtually no effect on the nested line response. The fitted model is of the form:

$$W \cong W_0 + a_1 D + a_2 [F^2 + a_3 \Delta\lambda + a_4 (\Delta\lambda)^2]$$

where $a_{1-4}$ are the free parameters. The quality of the fit over the full range of blur and +/−150 nm of defocus is <1 nm (3σ).

Figure 9:
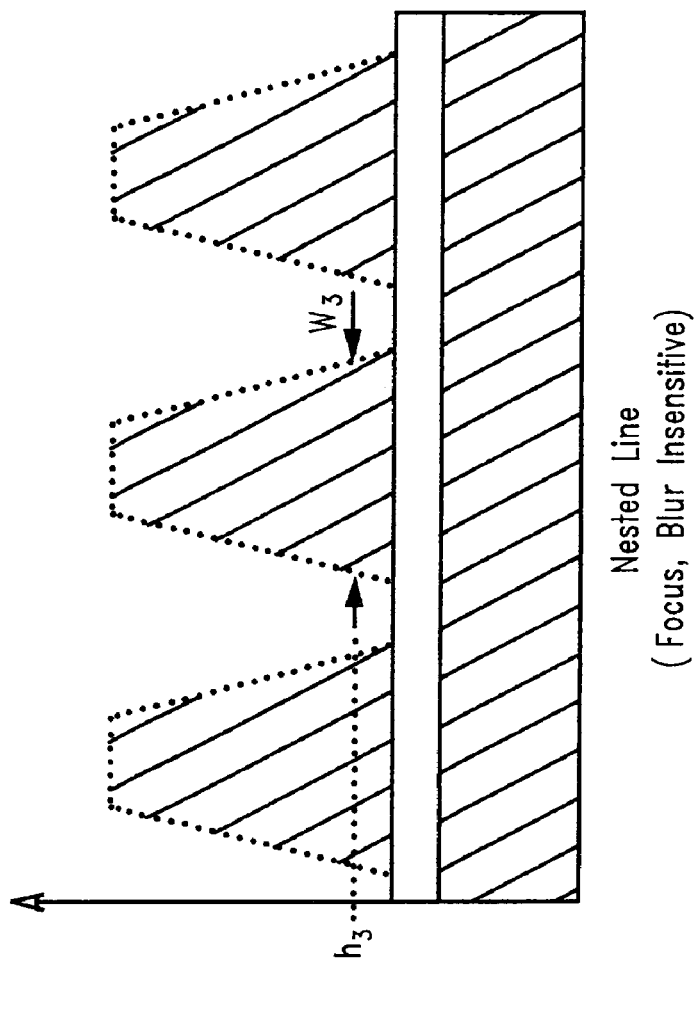
FIG. 9 is a side elevational view of the profiles of isolated and nested pattern features as lithographically produced in a resist layer on a wafer surface.
Figure 9:
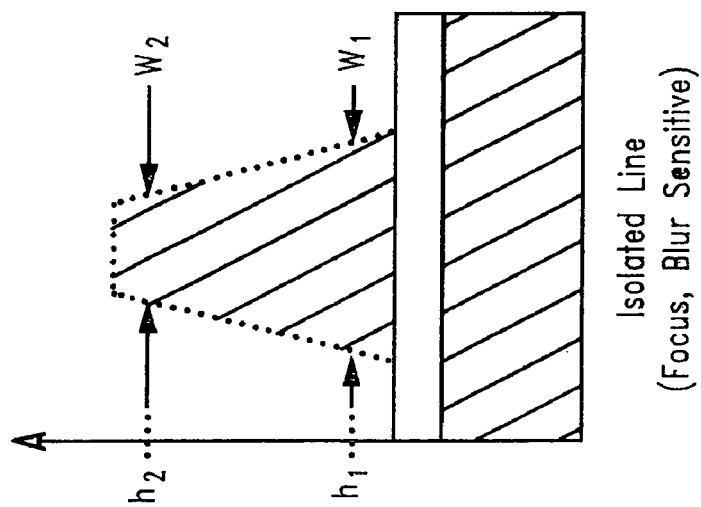

Thus, the demonstrated ability to model the response to blur, dose and defocus shows that the values of blur, dose and defocus can be determined from measurements of nested and isolated lines, by the inversion of models of the above form. Since there are three independent parameters to be determined, at least three distinct attributes ($W_1$, $W_2$, $W_3$) of the printed patterns must be measured. FIG. 9 depicts the profile, in side elevational view, of an isolated line 42 and nested lines 52, for the target configuration of FIG. 4, as formed in a resist layer 72 over a substrate layer 74 on wafer 70. As illustrated in FIG. 9, the attributes that enable deconvolution of dose, defocus and blur are the widths ($W_1$, $W_2$) of the isolated features at two different heights ($h_1$, $h_2$) on the resist profile and the width $W_3$ of the nested feature at a single height $h_3$ on the resist profile. The dependence of the widths $W_m$ on dose D, defocus F and blur T are described by the set of parametric equations:

$$W_m \cong W_{0m} + a_{3m} T^2 + (a_{1m} + a_{4m} T^2) D + (a_{2m} + a_{5m} T^2)(F^2 - 2S_m F + S_m^2) + \epsilon_m$$

where:
$W_{0m}$ = $m^{th}$ width at D=0, F=0 and T=0.
$a_{nm}$ = response coefficients of $m^{th}$ width.
$S_m$ = offset of best focus of $m^{th}$ width relative to best focus.
$\epsilon_m$ = residual error.

Figure 10:
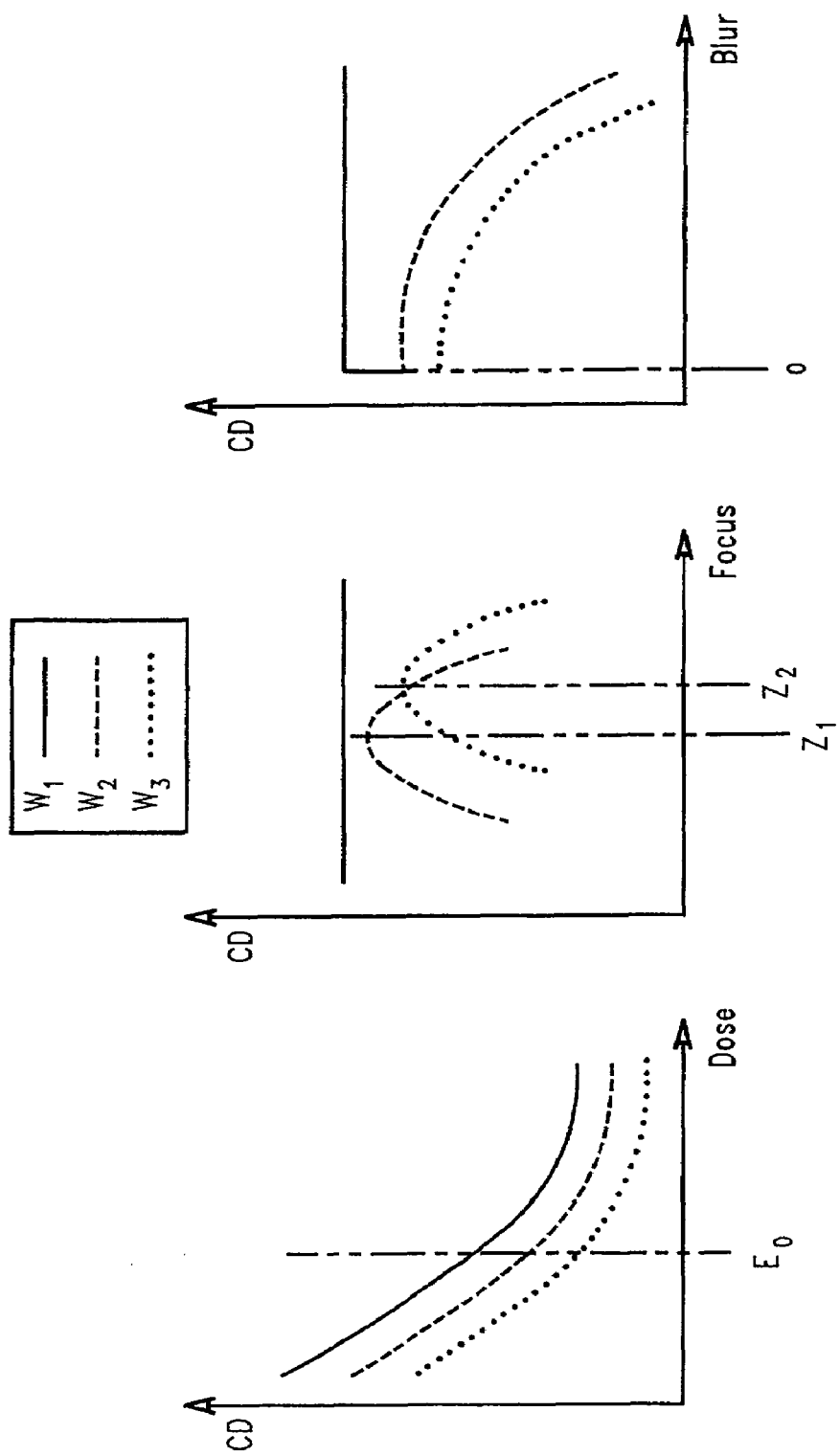
FIG. 10 is a graphical representation of the variation of critical dimension (CD) linewidth as a function of dose, focus and blur for line widths of isolated features at two different heights on the resist profile and the width of a nested feature at a single height on the resist profile.
Figure 11:
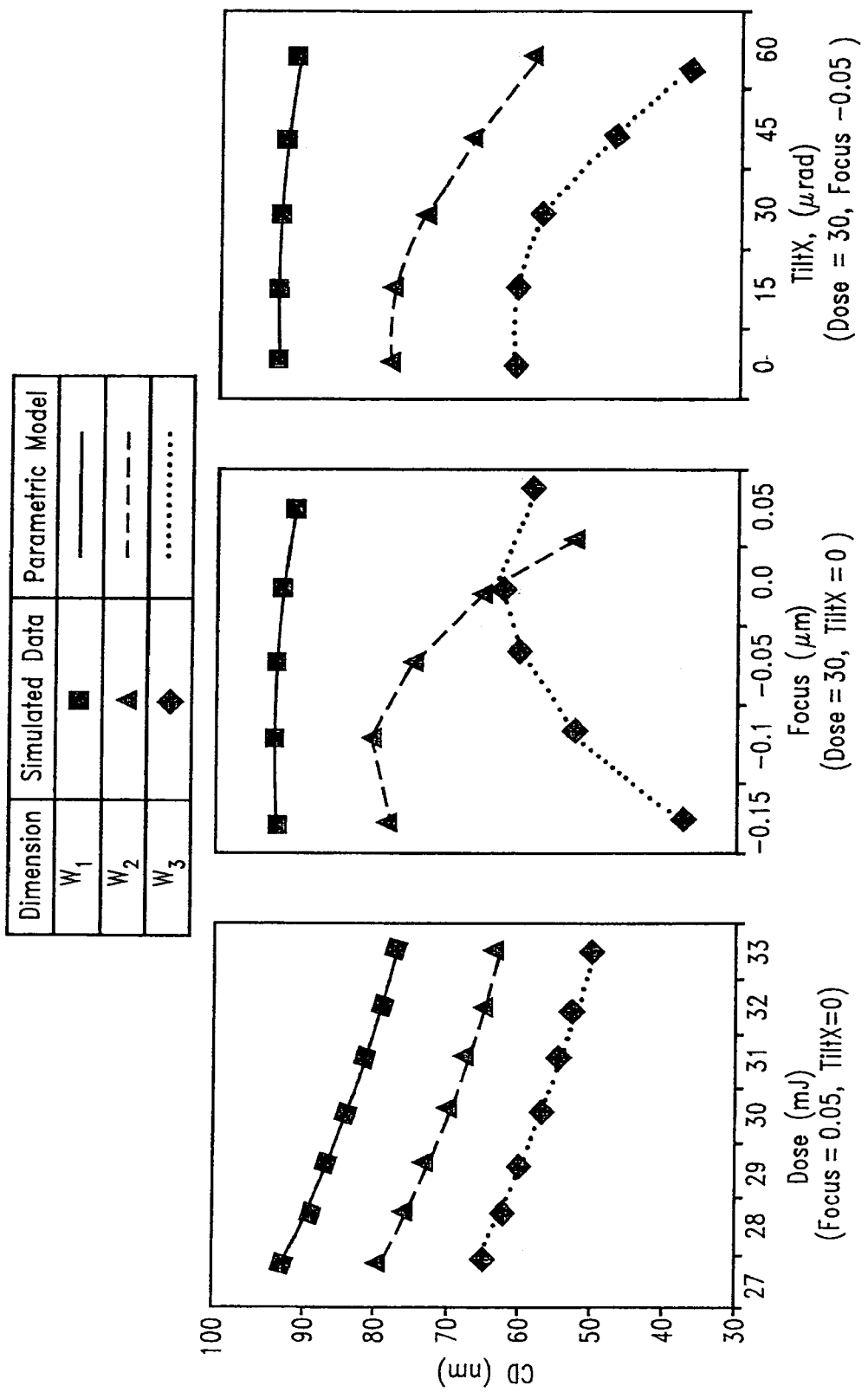
FIG. 11 is a graphical representation of simulated data points with the expected variation of linewidth as a function dose, focus and blur for isolated and nested linewidths of FIG. 10.

The expected variation of $W_{1-3}$ is shown in FIG. 10. For the nested width $W_3$ at or near the isofocal point, the above equation simplifies to:

$$W_3 \cong W_{03} + a_{13} D$$

As shown in FIG. 10, $W_3$ depends only on dose and is independent of defocus and blur over the regime of interest.

In the preferred embodiment the parameters are determined by fitting the above equation to measured widths $W_m$ through known changes to dose, focus and blur using available adjustments on the exposure tool. Dose and focus are varied by conventional means on a focus-exposure matrix (FEM). Blur is varied by adjusting the across-slit tilt of a step and scan exposure tool. Thus, the full setup experiment becomes a focus-exposure-tilt matrix (FETM).

A setup experiment for patterns of the type shown in FIG. 4 is simulated as follows. The mask patterns simulated consist of 130 nm lines formed in an attenuated phase shift film at two different pitches: 260 nm for a nested pattern and 520 nm for an isolated pattern. The exposure tool configuration is 0.85 NA 193 nm quadrapole illumination with a 0.25 picometer bandwidth. The wafer image is formed in a 240 nm thick 193 nm resist film. Simulated width measurements through the FETM are collected at the 10% and 90% heights on the resist profile.

For example, data is simulated for $W_{1-3}$ over a range of dose, focus and blur (tilt) settings, where $W_1$ and $W_2$ are the widths of the 520 nm pitch pattern at 10% and 90% heights, and $W_3$ is the width of the 260 nm pitch pattern at the 10% height. Dose settings are in the range of 27 to 33 mJ/cm² evaluated at 1 mJ/cm² increments.

Focus settings are in the range −0.15 to 0.05 μm in 0.05 μm increments. Tilt settings are in the range 0 to 60 μrad in 15 μrad increments.

The model fit to the simulation results is summarized in Table I. The blur T is expressed in units of equivalent tilt (grad). The blur effects are captured by parameters $a_{3-5}$. The simulated data points are compared to the fitted model in FIG. 11. The modeled curves are in good quantitative agreement with the discrete data points and show qualitative agreement with the expected variation of FIG. 10.

TABLE I

|  | $W_1$ | $W_2$ | $W_3$ | Units |
|---|---|---|---|---|
| $E_0$ | 30 | 30 | 30 | mJ/cm2 |
| $W_0$ | 74 | 61 | 84 | nm |
| S | 0 | 91 | −6 | nm |
| $a_1$ | −70 | −65 | −73 | nm |
| $a_2$ | −1099 | −1259 | −59 | nm$^{-1}$ |
| $a_3$ | −0.005 | −0.007 | 0.000 | nm × μrad$^{-2}$ |
| $a_4$ | −0.006 | −0.007 | −0.001 | nm × μrad$^{-2}$ |

TABLE I-continued

|  | $W_1$ | $W_2$ | $W_3$ | Units |
|---|---|---|---|---|
| $a_5$ | −0.010 | −0.119 | 0.001 | $nm^{-1} \times \mu rad^{-2}$ |
| $\epsilon(3\sigma)$ | 3.6 | 2.4 | 0.4 | nm |

Having defined the distinct dose, focus and blur response of at least three widths produced by a lithographic process, as by the parameters of Table I, all measurements of the widths produced by the same lithographic process can be converted to effective values of dose, defocus and blur. In general, this can be accomplished by the numerical inversion of equations of the above form.

For small excursions, analytic inversion is allowed by ignoring parameters $a_{2-5}$ of $W_3$ and parameters $a_{4-5}$ for $W_{1-2}$. Applying the approximate model for $W_3$ gives an expression for the effective dose D':

$$D' = \frac{W_3 - W_{03}}{a_{13}}$$

Neglecting higher order defocus and blur terms in the equations for $W_1$ and $W_2$ enables quadratic solutions for the effective defocus F' and blur T'. If the coefficients of a quadratic equation are defined as:

$$A \equiv a_{22} - \frac{a_{21}}{a_{31}}$$

$$B \equiv -2S_2 a_{22}$$

$$C \equiv -(W_2 - W_{02}) + \frac{a_{32}}{a_{31}}(W_1 - W_{01}) + \left(a_{12} - \frac{a_{32}}{a_{31}}a_{11}\right)D' + a_{22}S_2$$

then:

$$F' = \frac{-B + \sqrt{B^2 - 4AC}}{2A}$$

$$(B')^2 = \frac{W_1 - W_{01} - a_{11}D' - a_{21}(F')^2}{a_{31}}$$

Figure 12:
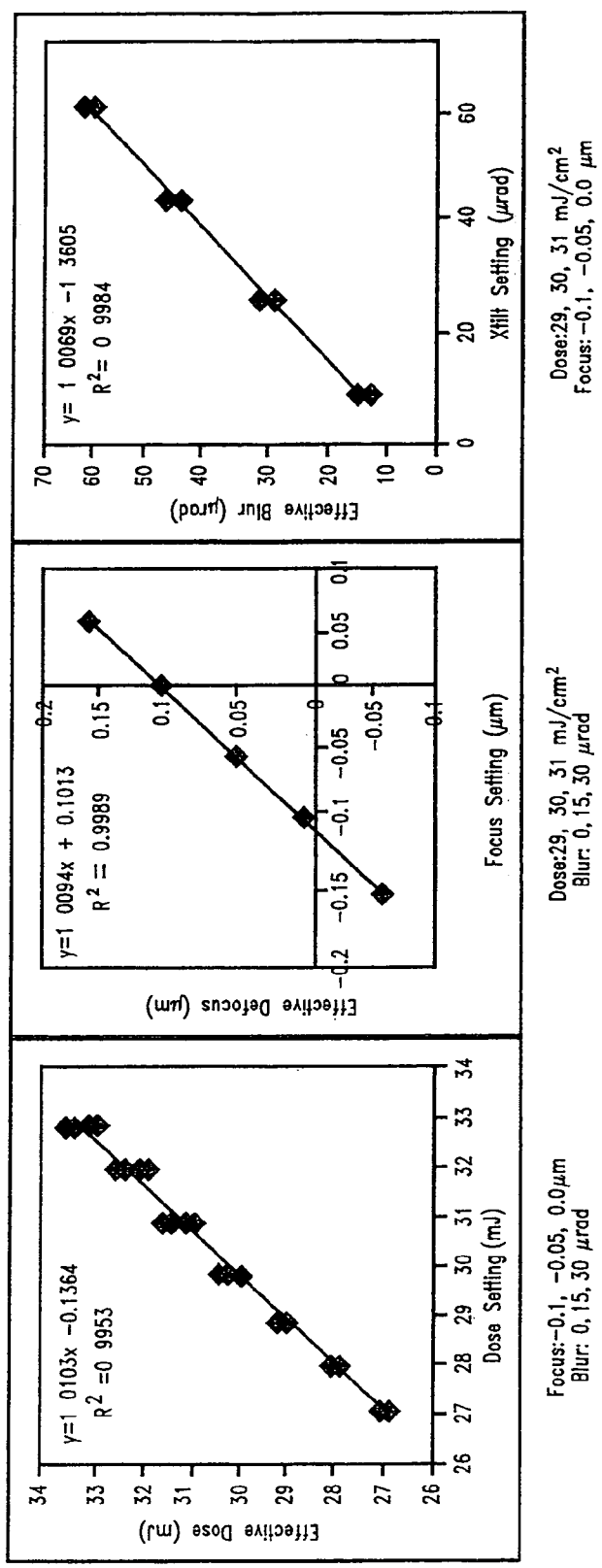
FIG. 12 is a graphical representation of the variation of linewidth as a function of defocus and spectral width for nested and isolated lines.

The validity of the analytic inversion may be readily verified by applying it to the simulated data. The results are shown in FIG. 12. Over reasonable ranges of dose, defocus and blur, each output response to the input settings is linear with a slope close to unity.

The method of the present invention uses the relative dimensional sensitivity of isolated to nested features through the lithographic process window to distinguish dose error, defocus and blur contributions to pattern variation. The method described herein measures the dimensions of nested and isolated features (simultaneously in the preferred embodiment) including appropriate target designs for optical and SEM metrology and analyzes those measurements to determine the corresponding dose error, defocus, and blur. Specific knowledge of the dose error, defocus and blur may then be incorporated in a feedback control system to enable the automated optimization of the patterning process.

Figure 13:
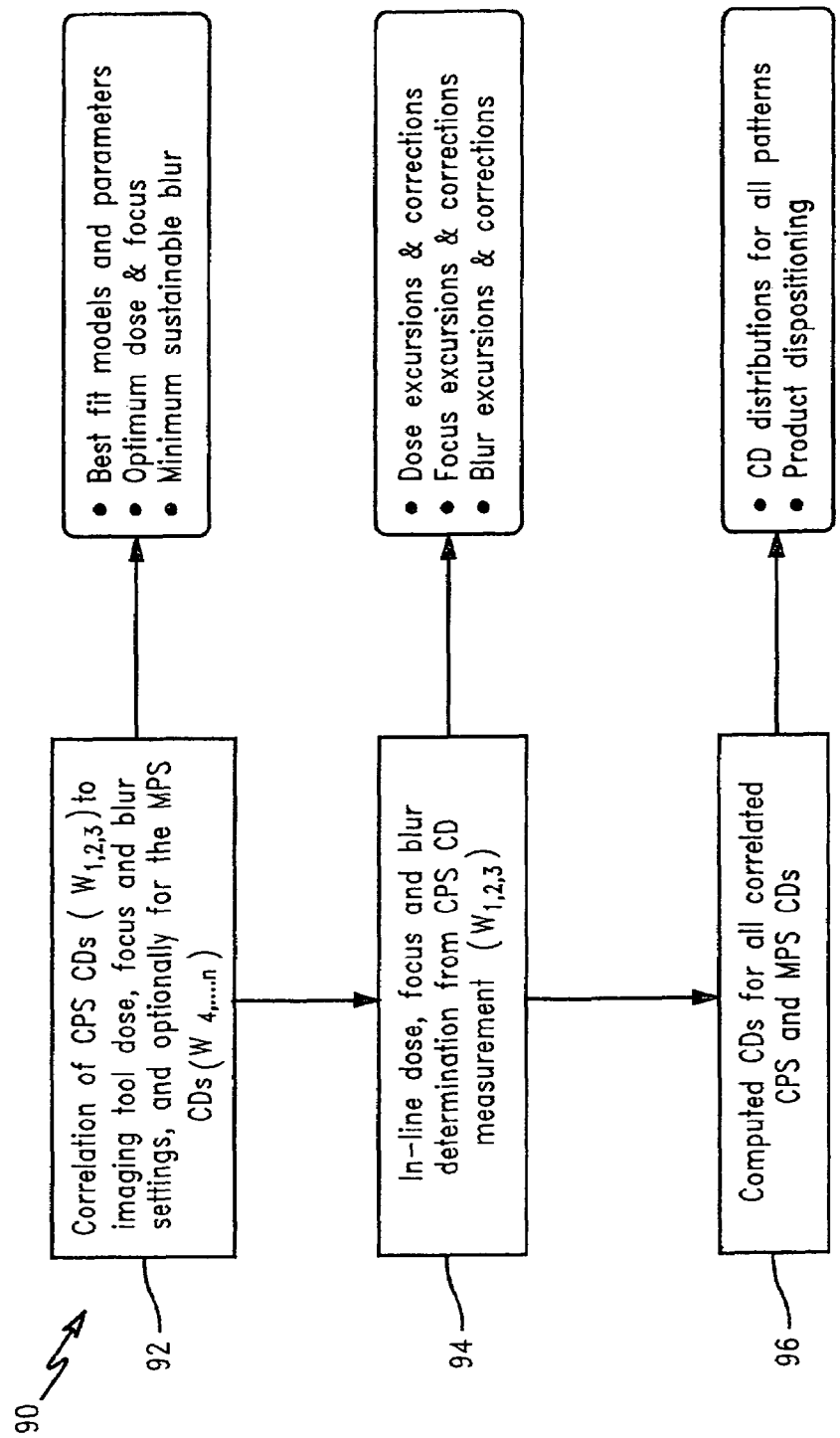
FIG. 13 is a flow chart summarizing the use of the method of the present invention into a lithographic control system to independently control defocus and blur error.
Figure 14:
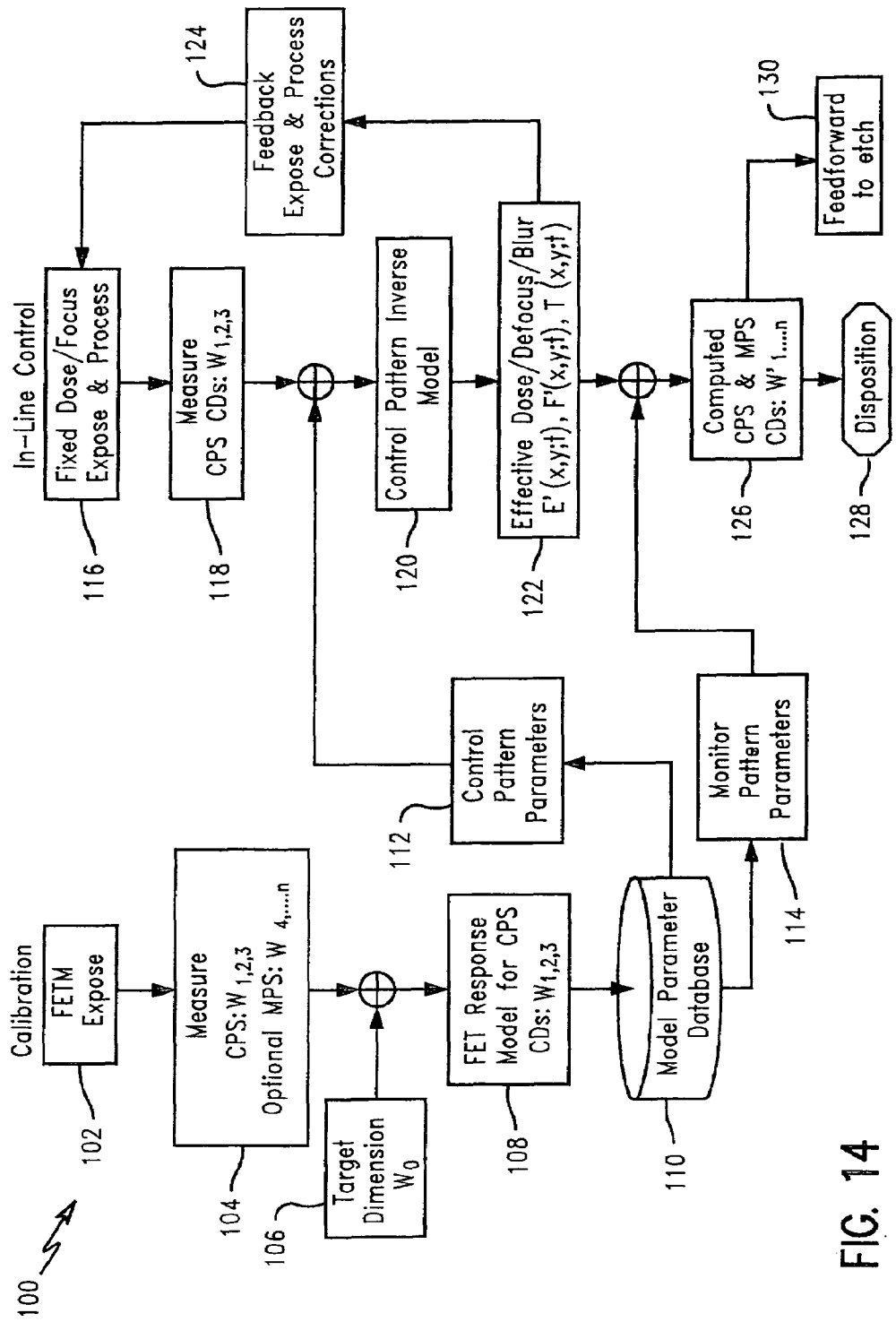
FIG. 14 is a flow chart showing the preferred embodiment of the present invention in a lithographic process control system to independently control defocus and blur error.

The flowcharts of FIGS. 13 and 14, respectively, illustrate the incorporation of the preferred method of the present invention into a control system. In the method summary 90 shown in FIG. 13, a control pattern set (CPS) is created in a resist layer, which a set of process compatible patterns similar to those of FIGS. 4 and 5 having at least three dimensions ($W_1$, $W_2$, $W_3$) with distinct sensitivity to effective dose, defocus and blur (E', F', T'). In a preferred embodiment the CPS includes one nested and one isolated pattern. Optionally, a monitor pattern set (MPS) may be additionally used, which is any other process-compatible patterns, including any of the functional circuit patterns to be lithographically produced on the wafer. The CPS and MPS CD widths are correlated to the imaging tool dose, focus and blur settings 92, to determine the best fit models and parameters for the system, the optimum dose and focus, and the minimum sustainable blur. Subsequently, the same CPS is created and the CD measured in-line in a production process to determine dose, focus and blur 94 by inversion of the models discussed above. This provides for independent dose, focus and blur excursions and corrections. Finally, the computed CD width measurements for the correlated CPS and MPS 96 determine the CD width distributions for all patterns, and enable product dispositioning.

Figure 5:
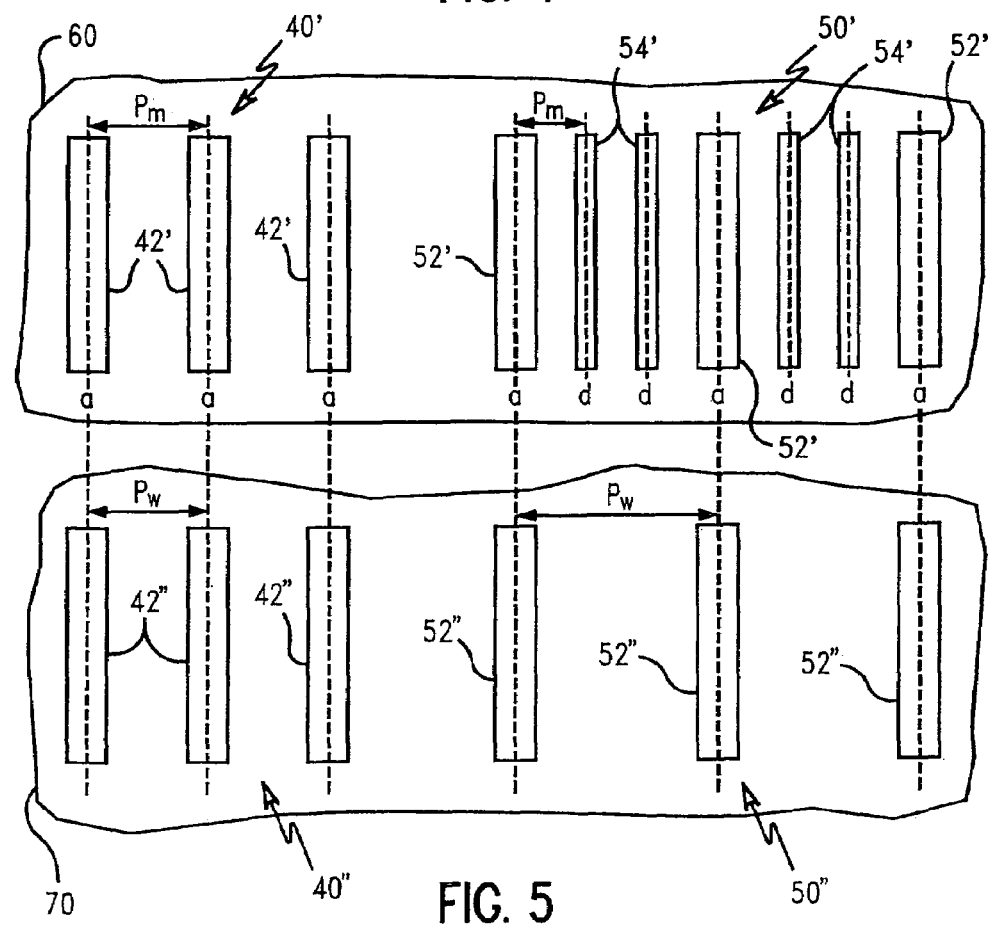
FIG. 5 is a top plan view showing isolated and nested feature patterns on a mask and as lithographically produced in a resist layer on a wafer surface, with the nested feature pattern including subresolution assist features not lithographically printed.

In the preferred embodiment of the method of the present invention 100 as shown in FIG. 14, one would print a first set of control pattern set (CPS), and optionally a monitor pattern set (MPS), in a lithographic resist layer of the type shown in FIG. 4 or 5, including both isolated and nested patterns 40 and 50, respectively. These pattern sets would be reproduced on a wafer at different defocus settings, near the isofocal dose, and at different spectral widths of the exposure illumination (as in FIG. 2) and/or different tilts of the image plane (as in FIG. 3) in a focus-exposure-tilt matrix (FETM) 102 to create different blur conditions. The widths of individual isolated and nested patterns at different spectral widths would be simultaneously measured 104, compared to the target dimension, and correlated to the dose and focus settings and the blur conditions of the pattern imaging system to produce dependencies for focus, exposure and tilt (FET) for the control pattern set 108. Preferably, two of the locations measured in this manner would be on the isolated patterns or features, which correspond to high defocus sensitivity, and one of the locations would be on the nested patterns or features, which correspond to low defocus sensitivity. The dependencies for the control pattern sets and any model pattern sets would be stored in a model parameter database 110, from which the control pattern parameters 112 or model pattern parameters 114 may be obtained.

Subsequently, for in-line control of the lithographic process, preferably on each wafer and more preferably at more than one location on each wafer, one would print similar control pattern sets of the type shown in FIG. 4 or 5 in a lithographic resist layer at the fixed dose, focus and exposure settings used in the process 116. One would then measure the same width dimensions for the isolated and nested patterns that match those measured in the first control pattern set. From a comparison of the subsequent control isolated and nested pattern sets with the matching first control pattern set parameters 112, and knowing the correlated dependencies, one would then create the control pattern inverse model 120 and determine the effective dose, defocus and blur values associated with forming the subsequent sets of control patterns 122. These dose, defocus and blur values can then be used to feed back modifications in settings to the lithographic imaging system 124 in the case that any of the dose, defocus and/or blur settings move outside of desired values. In particular, blur error can be independently controlled and minimized, separately and apart from defocus and dose error.

The computed critical dimensions of the control pattern and any monitor pattern sets on the wafer 126 may be sent for product disposition 128 or to etch 130.

The method of the present invention works both for the case of truly nested lines and quasi-nested lines (lines that are nested on the mask using assist features, but appear isolated on the wafer). The use of quasi-nested lines is important to measurement, as it would enable simultaneous measurement of both nested and isolated lines using non-zero order diffraction according to PCT/US2003/041438, filed Dec. 19, 2003, the disclosure of which is hereby incorporated by reference.

Thus, the present invention provide an improved lithographic system and improved utilization of measurements derived from CD metrology tools to monitor and control lithographic processing, and enables the user to distinguish between defocus and blur error so that blur error can be controlled and eliminated.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for optimizing imaging and process parameter settings in a lithographic pattern imaging and processing system is disclosed, the method comprising:

correlating the dimensions of a first set of at least one control pattern printed in a lithographic resist layer, measured at three or more locations on or within the pattern which correspond to differing dose, defocus and blur sensitivity, the locations of high defocus sensitivity on or within a pattern corresponding to different heights on the profile in the resist layer resulting from the image of a low density pattern and comprising isolated features for which pitch to an adjacent feature is significantly greater than twice the width of the smallest feature dimension and the location of low defocus sensitivity corresponding to a single height on the profile in the resist layer resulting from the image of a high density pattern and comprising nested features for which pitch to an adjacent feature is not significantly greater than twice the width of the smallest feature dimension, the dimensions of the first set of at least one control pattern being measured at different blur condition of the pattern imaging system varied by changing bandwidth of illumination or tilt of an image plane in the lithographic pattern imaging and processing system;

measuring the dimensions on subsequent sets of control patterns, printed in a lithographic resist layer, simultaneously at three or more locations on or within each pattern, of which a minimum of three locations match those measured in the first set; and determining the effective dose, defocus and blur values associated with forming the subsequent sets of control patterns by comparing the dimensions at the matching locations with the correlated dependencies.

2. A method of determining blur, focus and exposure dose error in lithographic imaging comprising:

providing nested and isolated features in a design to be lithographically patterned on a substrate;

lithographically patterning the nested and isolated features on a substrate at different focus settings for different blur conditions, the different blur conditions comprise different spectral widths of radiation used for the lithographic patterning or different tilts of the image plane, dimension of the isolated feature being sensitive to, and dimension of the nested feature being relatively insensitive to, the different focus setting for the different blur conditions;

measuring dimensions of the nested feature at the different focus settings for the different blur conditions;

simultaneously with the measuring of the nested feature, measuring dimensions of the isolated feature at the different focus setting for the different radiation blur conditions;

determining contribution of blur error based on shifts in the dimension of the isolated feature at the different focus setting for the different blur conditions with respect to dimensions of the nested feature; and determining focus and exposure dose error based on any shifts in the dimension of the isolated feature at the different focus setting for the different blur conditions with respect to dimensions of the nested feature.

3. The method of claim 2 wherein the different blur conditions comprise different spectral widths of radiation used for the lithographic patterning.

4. The method of claim 2 wherein the different blur conditions comprise different tilts of the image plane.

* * * * *